United States Patent [19]
Yamashita

[11] Patent Number: 5,378,971
[45] Date of Patent: Jan. 3, 1995

[54] PROBE AND A METHOD OF MANUFACTURING THE SAME

[75] Inventor: Satoru Yamashita, Kofu, Japan

[73] Assignees: Tokyo Electron Limited, Tokyo; Tokyo Electron Yamanashi Limited, Nirasaki, both of Japan

[21] Appl. No.: 108,240

[22] Filed: Aug. 19, 1993

Related U.S. Application Data

[63] Continuation-in-part of Ser. No. 800,001, Nov. 29, 1991, Pat. No. 5,266,895, and Ser. No. 943,492, Sep. 11, 1992, Pat. No. 5,325,052.

[30] Foreign Application Priority Data

Nov. 30, 1990 [JP] Japan ............................. 2-339803
Aug. 19, 1992 [JP] Japan ............................. 4-244157

[51] Int. Cl.⁶ ............................................. G01R 1/073
[52] U.S. Cl. ................................... 324/760; 324/72.5
[58] Field of Search ............... 324/158 P, 72.5, 158 F; 148/559

[56] References Cited

U.S. PATENT DOCUMENTS

| | | | |
|---|---|---|---|
| 3,613,001 | 10/1971 | Hostetter | 324/158 P |
| 3,781,681 | 12/1973 | Wagner et al. | 324/158 P |
| 4,225,819 | 9/1980 | Grau et al. | 324/158 F |
| 4,574,235 | 3/1986 | Kelly et al. | 324/158 P |

OTHER PUBLICATIONS

Wise, Edmund M.: Gold, recovery, properties and applications D. Van Nostrand Co., Inc., New Jersey 1964 (pp. 108–111).

*Primary Examiner*—Ernest F. Karlsen
*Attorney, Agent, or Firm*—Oblon, Spivak, McClelland, Maier, & Neustadt

[57] ABSTRACT

A probe is formed of an Au—Cu alloy essentially consisting of 74 to 76 parts by weight of gold and 24 to 26 parts by weight of copper, by a process comprising the steps of heating the alloy to at least 350° C. and gradually cooling the heated alloy to the room temperature in at least 5 hours.

7 Claims, 5 Drawing Sheets

PROBE AND A METHOD OF MANUFACTURING THE SAME

CROSS-REFERENCES TO THE RELATED APPLICATIONS

This application is a continuation-in-part of U.S. patent application Ser. No. 800,001 filed on Nov. 29, 1991, now U.S. Pat. No. 5,266,895, and U.S. patent application Ser. No. 943,492 filed on Sep. 11, 1992, now U.S. Pat. No. 5,325.052.

BACKGROUND OF THE INVENTION

1. Field of the Invention

The present invention relates to a probe apparatus for measuring electrical characteristics of a semiconductor device.

2. Description of the Related Art

As is known, a large number of semiconductor devices are formed on a semiconductor wafer by using a high-precision photographic transfer technique, and the wafer is incised in units of semiconductor devices. In such a semiconductor device manufacturing process, conventionally, the electrical characteristics of a semiconductor device as a semifinished product are tested and discriminated by using a probe apparatus upon mounting of the semiconductor device on the semiconductor wafer. Only the semiconductor devices that are determined to be non-defective from the result of the testing measurement are sent to the following steps, e.g., packaging, thus improving the productivity.

The probe apparatus has a wafer holding table movable in the X-Y-Z-$\theta$ directions. A probe card having a large number of probes corresponding to the electrode pads of the semiconductor devices is fixed above the wafer holding table. The semiconductor wafer is set on the wafer holding table, the wafer holding table is driven to bring the electrodes of the semiconductor devices into contact with the probes, and testing measurement is performed through the probes.

In recent years, it has been attempted to perform the testing measurement as described above at a high to the wafer holding table and heating the semiconductor wafer placed on the wafer holding table. In this case, heat from the wafer holding table is transferred to the probe card. Then, the probe card is sometimes deformed to displace the positions of the probes, thus disabling high-precision measurement. As an apparatus to solve this problem, an apparatus disclosed in, e.g., U.S. Pat. No. 5,124,639, is known. In this apparatus, a heating device is provided also to the probe card holding mechanism to preheat the probe card to a temperature similar to that of the semiconductor wafer. In this known apparatus, the heating device is provided to the support means for supporting the intermediate portions of the probes extending obliquely from the probe card. The inclination of the probes is controlled by this heating device, thereby positioning the distal ends of the styluses.

The packing density of the semiconductor devices has been increased recently, and the pitch of electrode pads of the semiconductor devices has been decreased and the number of electrodes pads of the semiconductor devices has been increased. Therefore, as disclosed in Published Unexamined Japanese Patent Application No. 3-224246 a probe card in which probes are arranged substantially vertically has been developed for practical applications to replace the probe card in which probes are arranged obliquely.

In the probe card having the vertical probes, the problem concerning the testing measurement at a high temperature is not solved. Thus, measurement of such vertical probe must be performed at a normal temperature.

SUMMARY OF THE INVENTION

It is an object of the present invention to provide a probe apparatus which is capable of performing measurement by vertical probes with high precision at a temperature other than a normal temperature, like testing measurement at a high temperature and which is hence suitable to measurement of semiconductor wafers having a high packing density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

A probe apparatus according to the preferred embodiment of the present invention will be described with reference to the accompanying drawings.

Figure 1:
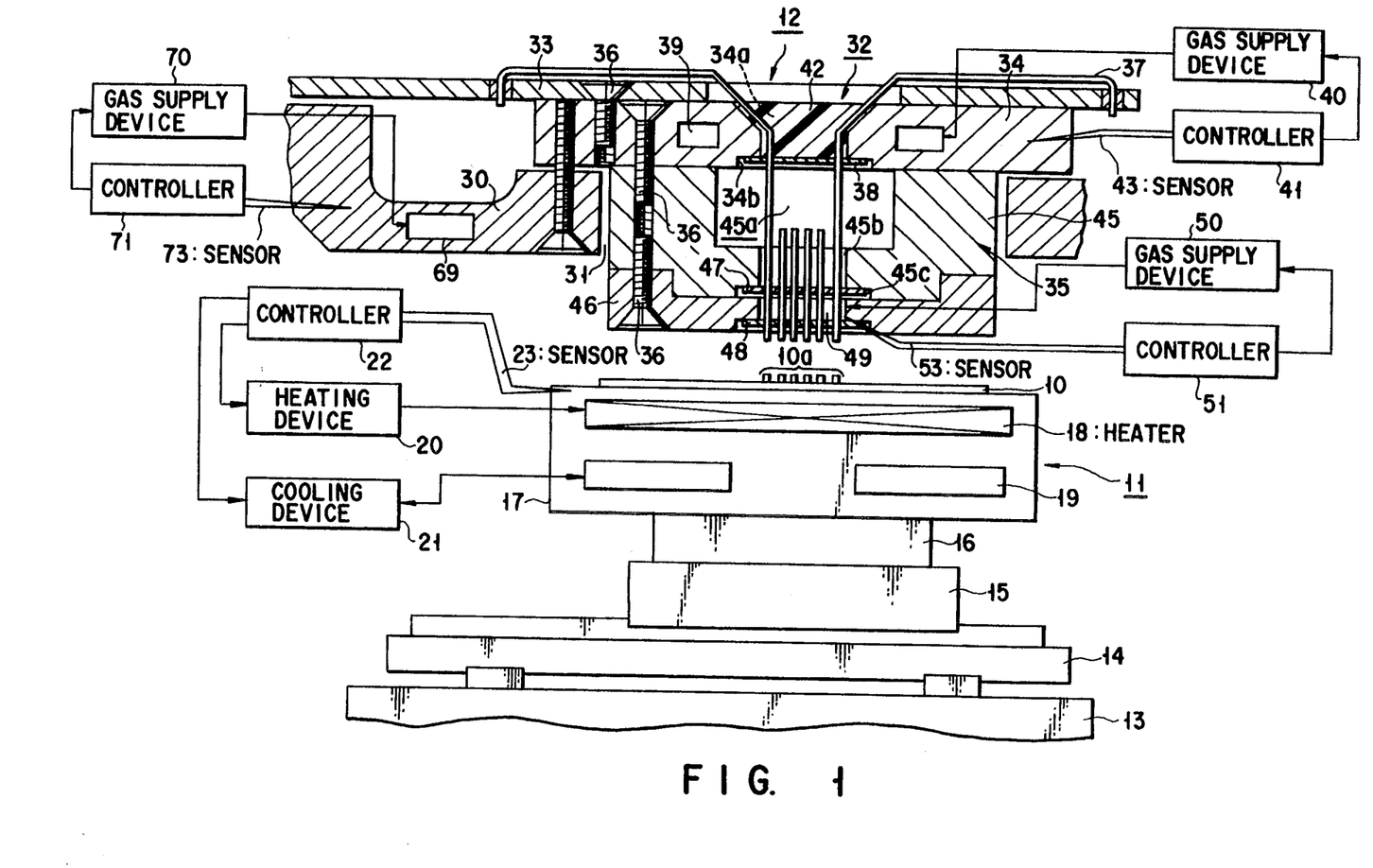
FIG. 1 is a view schematically showing a probe apparatus according to an embodiment of the present invention.

The probe apparatus comprises a wafer rest table 11 and a probe card mechanism 12, as shown in FIG. 1. A semiconductor wafer 10 on which a large number of semiconductor devices having a large number of electrode pads 10a on their upper surfaces are formed is placed on the wafer rest table 11. The wafer rest table 11 is movable in the X-Y-Z-$\theta$ directions.

The rest table 11 has X and Y stages 14 and 15. The X stage 14 is fixed on the paper surface of a base table 13 and movable in the x direction along two rails extending in the X direction to be parallel to each other. The Y stage 15 is movable on the X stage 14 in the Y direction along two rails extending in the Y direction. The X and Y stages 14 and 15 are driven within a horizontal plane in the X and Y directions by a known driving mechanism including a pulse motor and the like. A vacuum chuck 17 is provided on the Y stage 15 through a θ stage 16 rotatable about the Z axis (vertical axis). The θ stage 16 and the vacuum chuck 17 are driven by a known mechanism.

A large number of holes are formed in the upper surface of the vacuum chuck 17, and the semiconductor wafer 10 is chucked on the upper surface of the vacuum chuck 17 by a pressure-reducing mechanism (not shown) through these holes. The vacuum chuck 17 is made of a material, e.g., stainless steel which has a high thermal conductivity, and a heater 18 and a cooler or a cooling jacket 19 for selectively heating or cooling the vacuum chuck 17 are incorporated in the vacuum chuck 17. The heater 18 is constituted by, e.g., a heat coil, and the radiation temperature is adjusted by controlling current supplied to the heater 18. In this embodiment, the heat coil is connected to a power supply or heating device 20 provided outside the vacuum chuck 17 through a wire, so that the current is supplied from the power supply or heating device 20 to the coil.

The cooler 19 is constituted by a conduit which is buried in the vacuum chuck 17 and through which a cooling fluid. e.g., a cooling gas and a cooling water, flows. The inlet and outlet ports of the conduit are connected to the outlet and inlet ports, respectively, of a cooling device 21 through pipes. When the cooling fluid is circulated between the cooling device 21 and the cooler 19, the vacuum chuck 17 can be cooled to a predetermined temperature. The cooling device 21 and the power supply 20 cause the corresponding temperature control members 19 and 18 to perform cooling or heating to a desired temperature on the basis of an output signal from a controller 22. The temperature control mechanism of the vacuum chuck 17 is thus constituted. The controller 22 outputs a signal in response to a temperature detection signal supplied from a temperature sensor 23 for detecting the temperature of the vacuum chuck 17. In this embodiment, the output signal from the controller 22 is supplied to the power supply 20 to control the current to be supplied to the heater 18, and is simultaneously supplied to the cooling device 21 to control the temperature or the flow amount of the fluid to be supplied to the cooler 19.

Figure 2:
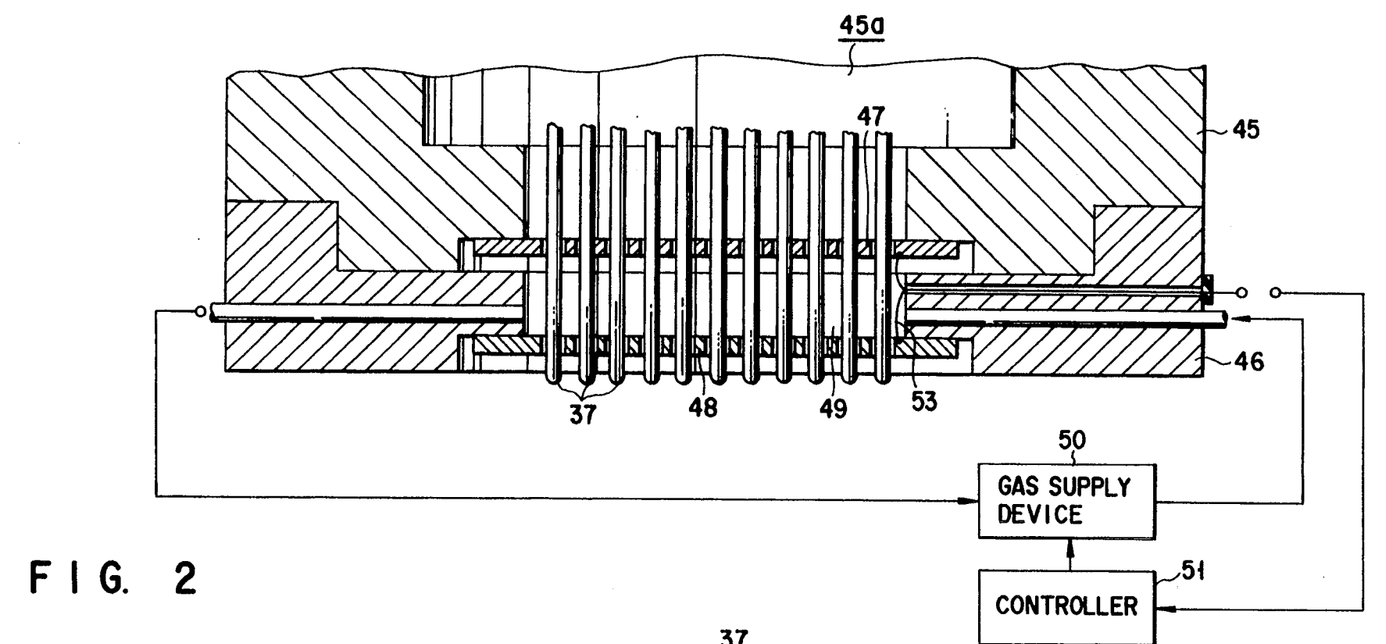
FIG. 2 is a partial enlarged view of the apparatus of FIG. 1.

The probe card mechanism 12 has a support ring 30 which is fixed on a probe apparatus body (not shown) to be located above the wafer rest table 11 and which has a opening 31 at its central portion. A probe card 32 is exchangeably supported on the probe ring 30 to oppose the semiconductor wafer 10 supported on the wafer rest table 11 at a predetermined gap. The probe card 32 has and a probe positioning portion 35 which have disk-like shapes, are coaxially stacked on each other, and are fixed with each other by bolts 36. The probe support portion 34 located at the intermediate portion has an outer configuration larger than that of the probe positioning portion 35 therebelow. When the peripheral step defined by the portions 34 and 35 in this manner is placed on the upper surface of the support ring 30 near its opening, the probe card 32 is supported on the support ring 30 such that its probe positioning portion 35 extends downward through the opening 31. The printed board portion 33 is made of a synthetic resin and has an electric wiring on its upper surface. A large number of through holes are formed near the outer periphery of the printed board portion 33. The proximal ends of a large number of probes 37 are inserted in these through holes. The probes 37 are fixed to the printed board portion 33 at their proximal ends by a solder. The proximal ends of the probes 37 are electrically connected to the electrical wiring. The contact pins of a tester are respectively connected to the electrical wiring, thereby performing testing measurement of the semiconductor wafer 10 to be described later. The probes 37 extend on the upper surface of the printed board portion 33 from almost their proximal end portions toward the central portion of the printed board portion 33 to be parallel to each other at predetermined gaps. The intermediate portions of the probes 37 are bent downward to extend downward through the central opening of the printed board portion 33. The probes 37 are further bent at a central opening 34a of the probe support portion 34 to positioning portion 35.

The probe support portion 34 is made of a metal having a high rigidity, e.g., SUS (stainless steel) suppress the deformation of the probe due to the pressure applied to the tip thereof and increase the degree of a parallel relationship between the table 11 and card 32. The wall surface defining the central opening 34a which is formed at the central portion of the probe support portion 34 and through which the probes 37 extend forms an inclined surface corresponding to the inclined buckle portions of the probes 37, and has a slight gap with respect to the probes 37. A recess 34b having a diameter larger than that of the central opening 34a and coaxial with the central opening 34a is formed in the central portion of the lower surface of the probe support portion 34. A fixing plate 38 is mounted on the support portion 34 in the recess 34b to close the lower end of the central opening 34a. A large number of through holes aligned with a predetermined pattern are formed in the fixing plate 38, and the probes 37 extend through the through holes. In this state, a synthetic resin 42, e.g., an epoxy resin, is filled in the central opening 34a and cured to fix the intermediate portions of the probes 37 with the probe support portion 34.

A heater/cooler or air Jacket 39 is formed in the probe support portion 34. The inlet and outlet ports of the heater/cooler 39 are connected to the outlet and inlet ports, respectively, of a gas supply device 40 through pipes. When a gas heated or cooled to a predetermined temperature is circulated between the heater/cooler 39 and the gas supply device 40, the probe support portion 34 can be set at a predetermined temperature. The gas supply device 40 causes the heater/cooler 39 to perform cooling or heating to a desired temperature on the basis of an output signal from a controller 41. The controller 41 outputs a signal in response to a temperature detection signal supplied from a temperature sensor 43 for detecting the temperature of the probe support portion 34. The temperature control mechanism of the probe card 32, especially of the printed board portion 33 and the probe support portion 34, is thus constituted. In this embodiment, the output signal from the controller 41 controls the temperature or flow amount of the fluid to be supplied to the heater/cooler 39.

The probe positioning portion 35 is made of a metal, e.g., brass, and has an upper portion 45 having an upper surface mounted on the lower surface of the probe support portion 34, and a lower portion 46 having an upper surface mounted on the lower surface of the upper portion 45 and a lower surface from which the distal ends of the probes 37 extend downward. A through hole constituted by three concentric portions 45a, 45b, and 45c having different diameters is formed in the central portion of the upper portion 45. The upper two portions 45a and 45b are set relatively long so that the probes 37 can buckle in them, as will be described later. The lower portion 45c has a diameter larger than that of the middle portion 45b, and a first positioning plate 47 is mounted on the portion 45 in the lower through hole portion 45c to close the lower end of the middle portion 45h. A through hole constituted by two portions 46a and 46b concentric with the circular through hole in the upper portion 45 and having different diameters is formed in the central portion of the lower portion 46. The lower portion 46b has a diameter larger than that of the upper portion 46a, and a second positioning plate 48 is mounted in the lower portion 46b to close the lower end of the upper portion 46a.

Hence, of the central through hole in the upper portion 45, the space sandwiched between the first and second positioning plates 47 and 48 is defined as an air jacket 49.

A large number of through holes are formed in each of the positioning plates 47 and 48, and the lower portions of the probes 37 are inserted in these through holes. To assemble the probe card 32, the intermediate portions of the probes 37 are fixed to the probe support portion 34 by filling the synthetic resin 42 in the opening 34a, and thereafter the positioning plates 47 and 48 through which the distal end portions of the probes 37 are inserted are mounted on the upper and lower portions 45 and 46, respectively, so that the tips of the probes 37 are maintained at predetermined positions by the upper and lower portions 45 and 46.

Each of the positioning plates 47 and 48 is constituted by an electrically insulating thin plate, and is constituted by a thin plate made of a synthetic resin, glass, or a ceramic having a thickness of about 0.3 mm in this preferred embodiment. The diameter of each of the through holes which are formed in the upper and lower portions 45 and 46 and through which the probes 37 are inserted is preferably set larger than that of the diameter of each probe 37 by about 10 μm, and is preferably. e.g., 80 to 110 μm when the probes 37 each having a diameter of 70 to 100 μm are to be used.

The inlet and outlet ports of the air jacket 49 are connected to the inlet and outlet ports, respectively, of a gas supply device 50 through pipes. When a gas heated or cooled to a predetermined temperature is circulated between the air jacket 49 and the gas supply device 50, the air jacket 49 and hence the positioning plates 47 and 48 can be set at a predetermined temperature. The temperature control mechanism of the probe card 32, especially of the positioning plates 47 and 48, is constituted by the gas supply device 50, a controller 51, and a temperature sensor 53. The gas supply device 50 causes the air jacket 49 to perform cooling or heating to a desired temperature on the basis of an output signal from the controller 51. The controller 51 outputs a signal in response to a temperature detection signal supplied from the temperature sensor 53 for detecting the temperature of the probe support portion 34. In this embodiment, the output signal from the controller 51 controls the temperature or flow amount of the fluid to be supplied to the air jacket 49.

A heater/cooler or air Jacket 69 for selectively heating the support ring 30 to a predetermined temperature by a temperature control mechanism is formed in the support ring 30 as well. The inlet and outlet ports of the heater/cooler 69 are connected to the outlet and inlet ports, respectively, of a gas supply device 70 through pipes. When a gas heated or cooled to a predetermined temperature is circulated between the heater/cooler 69 and the gas supply device 70, the support ring 30 can be set at a predetermined temperature. The gas supply device 70 causes the heater/cooler 69 to perform cooling or heating to a desired temperature on the basis of an output signal from a controller 71. The controller 71 outputs a signal in response to a temperature detection signal supplied from a temperature sensor 73 for detecting the temperature of the support ring 30. In this embodiment, the output signal from the controller 71 controls the temperature or flow amount of the fluid to be supplied to the heater/cooler 69.

One example of the probe 37 will be described with reference to FIGS. 3 and 4.

Figure 3:
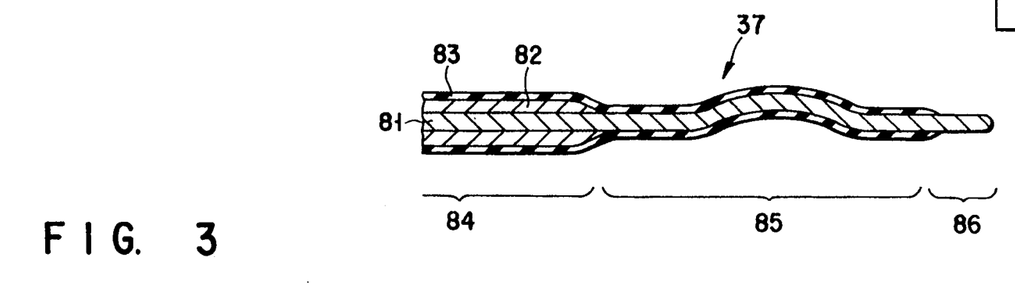
FIG. 3 is a sectional view of an arrangement of a probe.

As shown in FIG. 3, this probe 37 is constituted by a wiring portion 84, a buckle portion 85, and a distal end portion 86. The wiring portion 84 is obtained by sequentially forming a conductive layer 82 made of, e.g., copper to decrease the conductor resistance and an insulating layer 83 formed thereon, on the outer surface of a core wire 81 made of, e.g., Au—Cu, W Pd—Ag, and Be—Cu. The buckle portion 85 is capable of buckling and obtained by directly forming only the insulating layer 83 on the outer surface of the core wire 81. The core wire 81 is exposed from the distal end portion 86. The buckle portion 85 is located in the through hole portion 45a in the upper portion 45 to impart a spring function to the probe 37. As a result, the distal end portion 86 is movable in the vertical direction.

Figure 4:
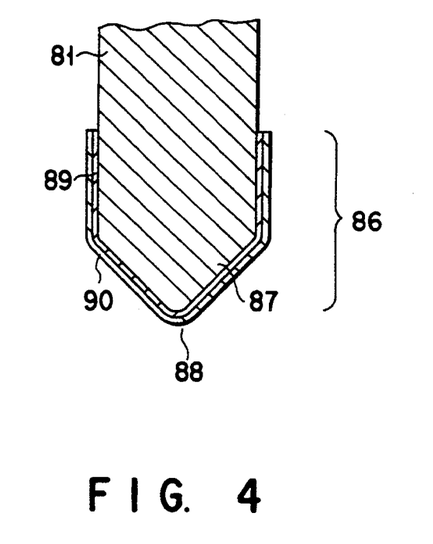
FIG. 4 is a sectional view showing the distal end portion of the probe shown in FIG. 3.

A tip 87 of the distal end portion 86 of the probe 37 forms a substantially conical shape having a vertex of, e.g., about 90°, as shown in FIG. 4. A flat portion 88 having a diameter of about 10 to 20 μm is formed at the central portion of the tip 87. The tip 87 and a portion of the core wire 81 near the tip 87 are covered with an Au plating layer 90 having a thickness of about 0.5 μm through an undercoating plating layer 89 made of, e.g.. Ni having a thickness of about 0.5 μm. The Au plating layer 90 formed on the surface of the flat portion 88 electrically contacts an electrode pad when testing measurement of the semiconductor device is to be performed, so that the contact resistance between the electrode pad and the Au plating layer 90 is decreased.

Another embodiment of the probe 37 will be described with reference to FIGS. 5 to 8.

Figure 5:
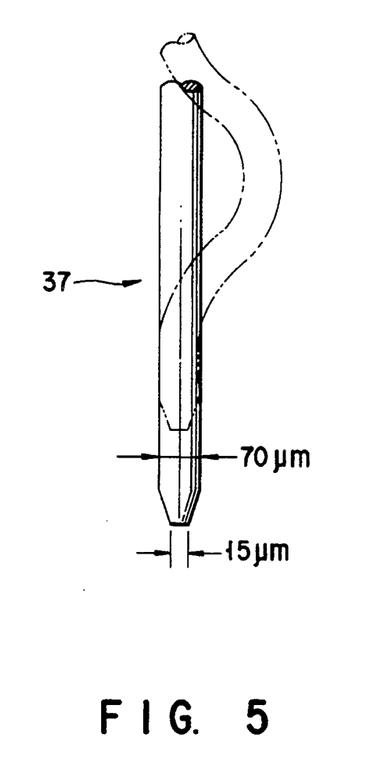
FIG. 5 is a perspective view of a modification of the probe.

As shown in FIG. 5, a tip of the distal end portion of the probe 37 forms a conical shape, the end face of which is flat. In the preferred embodiment, the diameter of the flat face is 15 μm, the outer diameter of the probe 37 is 70 μm, and the length thereof is 51 mm. These dimensions are set to measure a semiconductor wafer on which electrode pads of 60 μm square are arranged at 100 μm pitch. The two-dot chain line in FIG. 5 represents the state where the probe 37 is buckled by buckling load when pressured against a pad of a semiconductor wafer.

The probe 37 is formed of an Au—Cu alloy containing gold and copper in the ratio of the numbers of atoms 1:1. More specifically, the alloy mainly consists of 74 to 76 parts by weight of gold and 24 to 26 parts by weight of copper. The Au—Cu alloy is not limited to that in the degree of purity of 100%, but may be that in a degree of purity of approximately 100% containing a very small amount of inevitable impurities such as Ag, Ni, Fe, C, and O.

The Au—Cu alloy is formed into a wire of a shape of the probe or a long wire having the same diameter as the probe. Thereafter, the wire is heat-treated as follows to form the probe 37.

Figure 6:
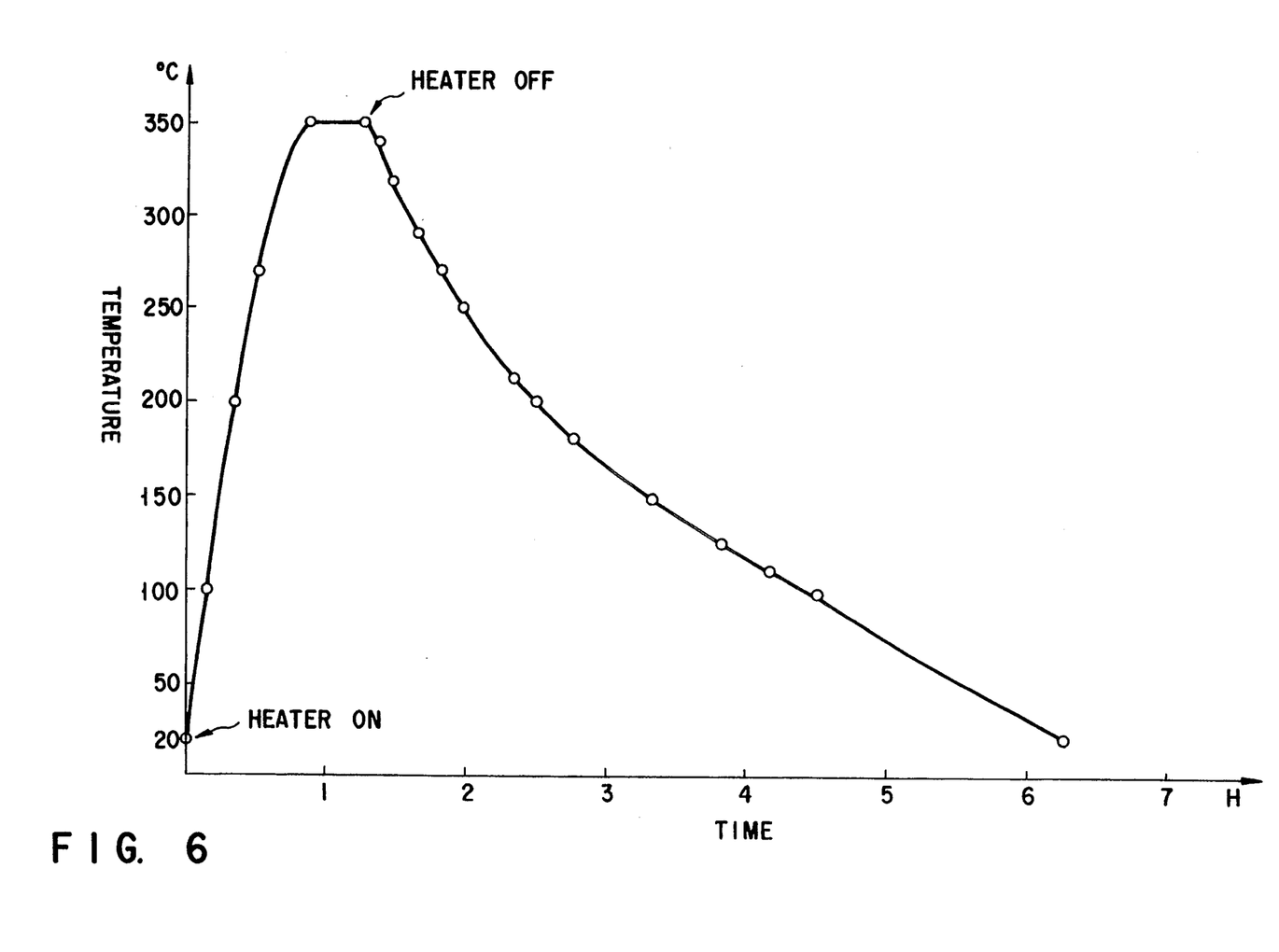
FIG. 6 is a graph showing the relationship between the temperature and the time in a process of heat-treating a wire.
Figure 7:
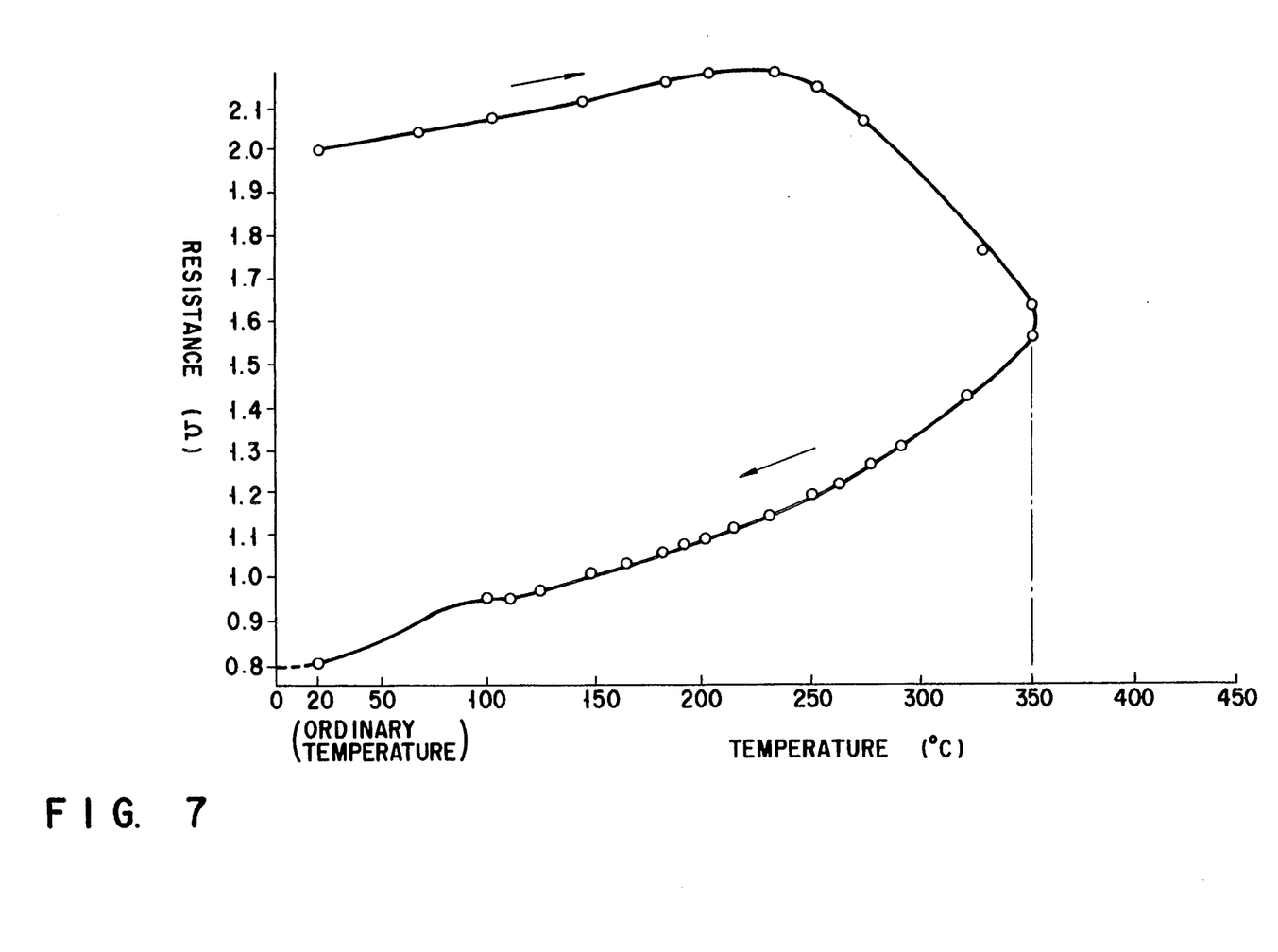
FIG. 7 is a graph showing the relationship between the resistance and the temperature in a process of heat-treating a wire.

The wire is heated above 350° C., preferably to 350° C. in a constant temperature bath. The wire is maintained at the maximum temperature for 30 minutes, and then, gradually cooled in 5 hours or more to an ordinary temperature. Thus, the wire is annealed. FIG. 6 is a graph showing the relationship between the time and the temperature in a case where the Au—Cu alloy wire is actually heated to 350° C. and then annealed. In FIG. 6, the ordinate represents the temperature of the wire and the abscissa represents the period of time in which the wire is heated and cooled. As clearly shown in this graph, it took about 5 hours to cool the wire from 350° C. to about 20° C. FIG. 7 shows data obtained by measuring the change in temperature of the wire during the heat treatment. In FIG. 7, the ordinate represents the electrical resistance of the entire wire and the abscissa represents the temperature of the wire during the heat treatment. As is shown in the graph, the electric resistance of the Au—Cu alloy wire is about 2.06 Ω before the heat treatment, and reduced to about 0.84 Ω after the heat treatment, i.e., 40% of the resistance before the heat treatment.

The reduction of the electric resistance results from a so-called superlattice in which Au and Cu atoms of the Au—Cu alloy are regularly arranged in lattices. In general, gradual cooling is started from a temperature above 420° C. to form a superlattice. However, in this embodiment, the wire is gradually cooled by self-cooling from a much lower temperature, i.e., 350° C. In this case, the electric resistance of the A—Cu alloy can be lowered if the wire is heated to a temperature of 350° C. or above. Since the higher the temperature, the greater the heat deformation, it is preferable that the wire be heated to a temperature of about 400° C. to 350° C., more preferably, 350° C. Although a deformed wire can be straightened, heating of the wire at about 350° C. is preferable to avoid an additional step for straightening.

The above data was obtained in the case of an A—Cu alloy consisting mainly of 75 parts by weight of gold and 25 parts by weight of copper. However, an alloy consisting of 74 to 76 parts by weight of gold and 24 to 26 parts by weight of copper will provide the same effect as described above. An A—Cu alloy having a composition beyond this range is not preferable, since such an alloy has a high electric resistance.

Figure 8:
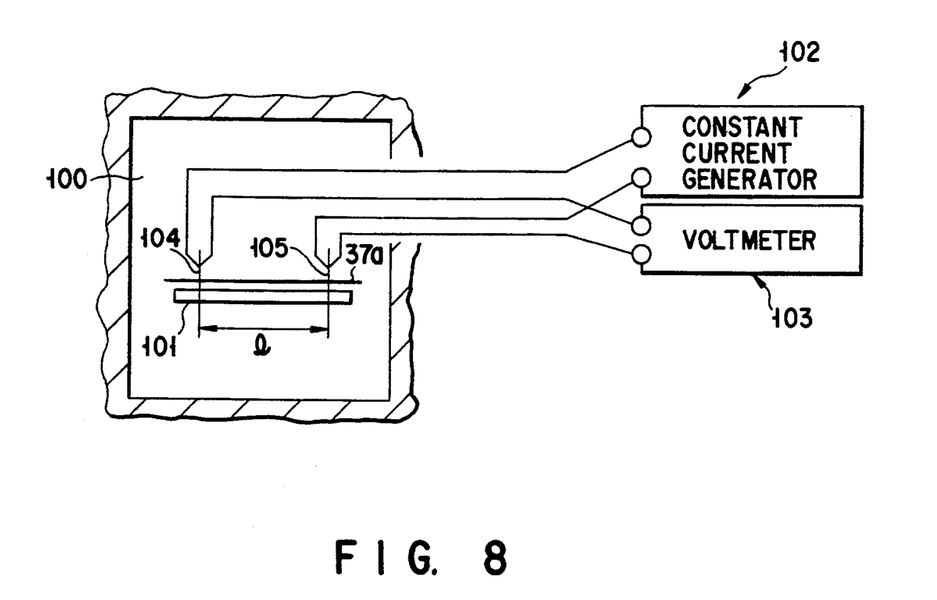
FIG. 8 is a diagram for explaining measurement of the resistance of a wire.

FIG. 8 shows a testing device for measuring the electric resistance of the probe. The testing device comprises a constant temperature bath 100, a ceramic substrate 101 arranged therein, a constant current generator 102, and a voltmeter 103. An A—Cu alloy wire 37a for forming a probe 37 is placed on the ceramic substrate 101. Terminals 104 and 105 of the constant current generator 102 and the voltmeter 103 are connected to the wire 37a with a distance L provided therebetween. The distance z corresponds to the length of a completed probe 37, i.e., 51 mm in this embodiment.

In the test, the inside of the constant temperature bath 100 is heated and cooled in accordance with the temperature-time curve shown in FIG. 6. Meantime, a constant current (10 mA in this embodiment) is caused to flow between the ends of the wire 37a and the voltage therebetween, to measure the resistance of the portion of the length l of the wire 37a.

The probe can be obtained either by cutting the heat-treated A—Cu alloy wire to the length of the probe or by heat-treating an A—Cu alloy wire which has been cut to the length of the probe.

The surface of the probe 37 except for the tip portion may be coated with an insulating film as indicated by the reference numeral 83 shown in FIG. 3.

Since the probe 37 obtained by the above heat treatment is formed of the A—Cu alloy, the contact resistance between the electrode on the semiconductor wafer and the probe is decreased and the durability of the probe is improved. In addition, since the resistivity is low as described above, voltage drop can be very small and heat generated due to the resistivity of the probe can be suppressed low, even if the probe is used in a power source for use in an electrical testing device for testing semiconductor wafers. Therefore, a probe having a minute diameter can be used in accordance with the increase in integration density of a semiconductor wafer.

The operation of the probe apparatus having the arrangement described above will be described.

The probe card 32 having the probes 37 matching the arrangement of the electrode pads 10a of the semiconductor devices of the semiconductor wafer 10 to be subjected to testing measurement is supported by the support ring 30. The air jackets 39 and 49 of the probe card 32 are connected to the corresponding temperature control mechanisms. When measurement is to be performed at a high temperature, the probe card 32 is heated to a predetermined temperature within 70° to 100° C. in advance. At the same time, the support ring 30 and the vacuum chuck 17 are connected to the corresponding temperature control mechanisms so as to be heated to 50° C. and a fixed temperature within 70° to 100° C., respectively. In this state, the semiconductor wafer 10 supported on the wafer rest table 11 is moved in the horizontal direction to align the electrode pads 10a with the tips of the probes 37 of the probe card 32. Subsequently, the wafer rest table 11 is moved in the Z direction to move the semiconductor wafer 10 upward until the electrode pads 10a abut against the tips of the probes 37. The wafer rest table 11 is over-driven to shift the tips of the probes 37 slightly upward. Upward shift of the probes 37 is achieved when the buckle portions 85 of the probes 37 located in the central through hole portion 45a buckle, as described above. In this state, electrical connection between the electrode pads 10a and the tips of the probes 37 become possible. Since the electrode pads 10a can be electrically connected to the tester (not shown) provided outside the probe apparatus through the printed board portion 33, the electrode pads 10a can be tested.

With the probe apparatus having the arrangement described above, during a high-temperature testing measurement, since the probe card 32 and the support ring 30 are heated in advance to corresponding temperatures as that of the heated semiconductor wafer 10, the probe card 32 will not be deformed by the heat from the semiconductor wafer 10 to positionally displace the tips of the probes 37, and the probes 37 and the electrode pads 10a can be brought into electrical contact with each other with a high precision. Since the horizontal shift of the tips of the probes 37 is controlled by, for example, the air jacket 49, the positional displacement of the probes 37 with respect to the electrode pads 10a can be prevented.

In this embodiment, the means for heating or cooling the respective components of the probe card mechanism is not limited to means using a fluid, e.g., a gas as described above, but can use electrical means, e.g. a coil.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe formed of an A—Cu alloy essentially consisting of 74 to 76 parts by weight of gold and 24 to 26 parts by weight of copper, by a process comprising the steps of heating the alloy to a predetermined temperature and gradually cooling the heated alloy.

2. A probe according to claim 1, wherein the predetermined temperature is at least 350° C.

3. A probe according to claim 1, wherein the predetermined temperature is a temperature between at least 350° C. and 400° C.

4. A probe according to claim 1, wherein the predetermined temperature is about 350° C.

5. A probe according to claim 1, wherein the heated alloy is gradually cooled to the room temperature in at least 5 hours.

6. A probe according to claim 1, wherein the heated alloy is cooled so that the resistance thereof is reduced to 40% of that of the alloy which has not been heated.

7. A probe formed of an A—Cu alloy having a resistance of about 0.84Ω per the length of the probe and essentially consisting of 74 to 76 parts by weight of gold and 24 to 26 parts by weight of copper.

* * * * *